(12) United States Patent
Freitag et al.

(10) Patent No.: US 11,383,110 B2
(45) Date of Patent: Jul. 12, 2022

(54) SMOKE AND FIRE SOURCE DETECTION SYSTEM, FIRE PROTECTION SYSTEM FOR AIRCRAFT AND METHOD FOR DETECTION OF SMOKE AND FIRE SOURCES

(71) Applicant: Airbus Operations GmbH, Hamburg (DE)

(72) Inventors: Klaus-Udo Freitag, Hamburg (DE); Yener Palit, Hamburg (DE)

(73) Assignee: Airbus Operations GmbH, Hamburg (DE)

( * ) Notice: Subject to any disclaimer, the term of this patent is extended or adjusted under 35 U.S.C. 154(b) by 126 days.

(21) Appl. No.: 16/832,821

(22) Filed: Mar. 27, 2020

(65) Prior Publication Data
US 2020/0306571 A1 Oct. 1, 2020

(30) Foreign Application Priority Data
Mar. 29, 2019 (DE) .......................... 102019204464.6

(51) Int. Cl.
*H05K 1/18* (2006.01)
*A62C 3/08* (2006.01)
(Continued)

(52) U.S. Cl.
CPC .............. *A62C 3/08* (2013.01); *H05K 1/118* (2013.01); *G08B 17/10* (2013.01); *H05K 2201/10151* (2013.01)

(58) Field of Classification Search
CPC ............ A62C 3/08; H05K 1/118; H05K 2201/10151; G08B 17/10
See application file for complete search history.

(56) References Cited

U.S. PATENT DOCUMENTS

| 6,958,689 | B2 | 10/2005 | Anderson et al. |
| 7,373,260 | B2 | 5/2008 | Kessler et al. |
| 9,988,160 | B1 | 6/2018 | Clos et al. |
| 2005/0126838 | A1* | 6/2005 | Vaughan .............. A63H 27/004 180/167 |

(Continued)

FOREIGN PATENT DOCUMENTS

| CN | 105999590 | 10/2016 |
| CN | 108562369 | 9/2018 |

(Continued)

OTHER PUBLICATIONS

European Search Report cited in EP 20163876.4 dated Jun. 25, 2020, 8 pages.

(Continued)

*Primary Examiner* — Binh B Tran
(74) *Attorney, Agent, or Firm* — Nixon & Vanderhye P.C.

(57) ABSTRACT

A smoke and fire source detection system including a flexible printed circuit board with a film substrate and an electrical conductor layer formed on the film substrate, which includes a two-dimensional conductor path pattern. The flexible printed circuit board includes a first end portion with an electronic control device and a data and energy supply interface coupled to the electronic control device, a second end portion with an ground connection, a data and energy supply conductor path formed in the electrical conductor layer between the data and energy supply interface of the first end portion and a ground connection of the second end portion, and one or more sensor module portions which are arranged at different longitudinal extension positions along the flexible printed circuit board between the first end portion and the second end portion and which each include a temperature sensor and/or smoke detector.

20 Claims, 3 Drawing Sheets

(51) Int. Cl.
  *H05K 1/11* (2006.01)
  *G08B 17/10* (2006.01)

(56) References Cited

U.S. PATENT DOCUMENTS

| | | | |
|---|---|---|---|
| 2010/0183044 A1* | 7/2010 | Tanaka | G01J 5/048 374/128 |
| 2011/0240798 A1 | 10/2011 | Gershzohn et al. | |
| 2013/0161078 A1* | 6/2013 | Li | H05K 1/147 174/254 |
| 2017/0147884 A1 | 5/2017 | Lorenzoni | |
| 2018/0242912 A1* | 8/2018 | Amimori | A61B 5/11 |
| 2018/0287383 A1 | 10/2018 | Freitag et al. | |

FOREIGN PATENT DOCUMENTS

| | | |
|---|---|---|
| EP | 2 396 971 | 12/2011 |
| EP | 3 253 185 | 12/2017 |
| WO | 2018/210147 A1 | 11/2018 |
| WO | 2018/210147 A9 | 11/2018 |
| WO | 2018210147 | 11/2018 |

OTHER PUBLICATIONS

Search Report for DE102019204464.6, dated Jan. 9, 2020, 14 pages.
Chinese Office Action in Chinese Patent Application 202010220525.1 (corresponding to this application)(dated Feb. 17, 2022).

* cited by examiner

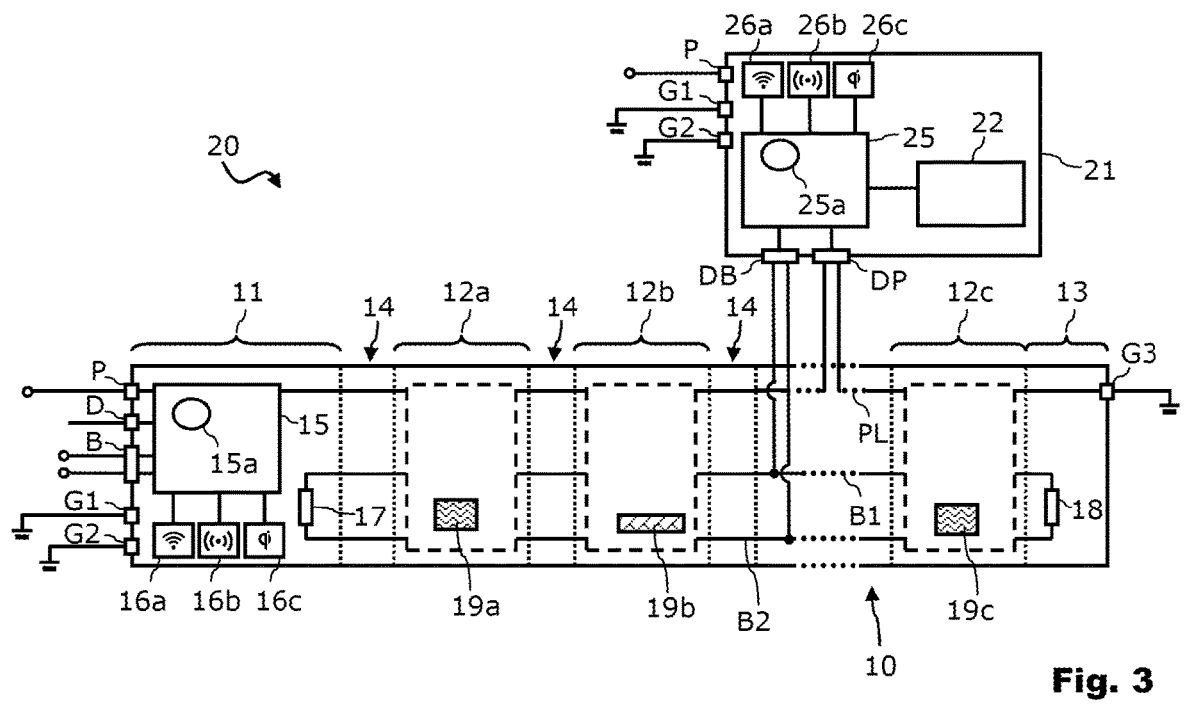
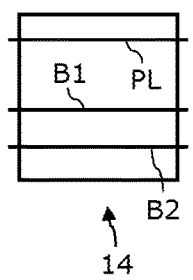 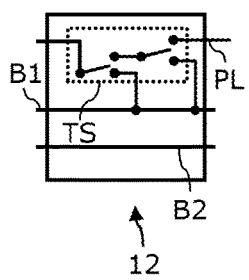 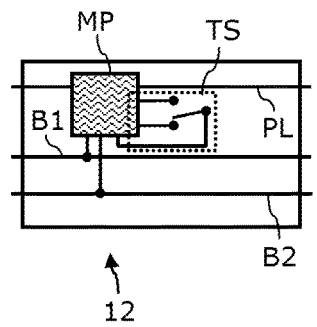 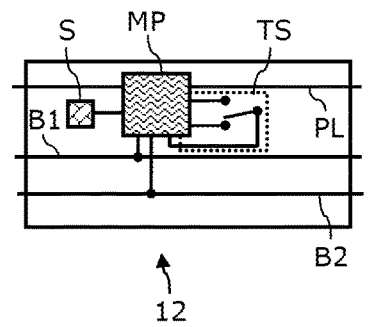
Fig. 5A  Fig 5B  Fig. 5C  Fig. 5D

SMOKE AND FIRE SOURCE DETECTION SYSTEM, FIRE PROTECTION SYSTEM FOR AIRCRAFT AND METHOD FOR DETECTION OF SMOKE AND FIRE SOURCES

RELATED APPLICATION

This application claims priority to German Patent Application DE 102019204464.6 filed Mar. 29, 2019, the entirety of which is incorporated by reference.

TECHNICAL FIELD OF THE INVENTION

The invention relates to a smoke and fire source detection system, a fire protection system for aircraft and a method for detection of smoke and fire sources, in particular for use in aircraft.

Although it can be used in many applications, the present invention and the problem on which it is based are explained in detail with reference to passenger aircraft. However, the methods, systems and devices described can also be used in different vehicles and in all areas of the transport industry, for example, road vehicles, rail vehicles, for aircraft or for watercraft.

TECHNICAL BACKGROUND

Fire alarm systems which are used in aircraft or other vehicles detect potential fire sources via the occurrence of various types of signs for such fire sources. For example, smoke detectors can detect the formation of smoke in their immediate surroundings. Temperature sensors can determine a local increase in temperature beyond the extent to be predicted. The effectiveness of fire alarm systems generally increases with the number of available sensors and the strategic placement thereof at locations at which a fire could break out with a higher probability than at others.

European Patent 2 396 971 B1, U.S. Pat. No. 6,958,689 B2 and U.S. Pat. No. 7,373,260 B2 disclose exemplary distributed sensor networks for use in fire protection systems in aircraft.

SUMMARY OF THE INVENTION

The inventors conceived and disclose herein smoke and fire source detection systems and/or fire protection systems for use, for example, in aircraft, whose early detection rate for the prevention of fires and whose significance for a defect search and defect elimination following supposed or actual detection of a potential fire source is improved compared with previous solutions.

A first aspect (embodiment) of the invention is a smoke and fire source detection system comprises a flexible printed circuit board with a film substrate and an electrical conductor layer formed on the film substrate, which comprises a two-dimensional conductor path pattern in the plane of the electrical conductor layer. The flexible printed circuit board here comprises a first end portion with an electronic control device and a data and energy supply interface coupled to the electronic control device, a second end portion with an ground connection, a data and energy supply conductor path formed in the electrical conductor layer between the data and energy supply interface of the first end portion and the ground connection of the second end portion, and one or more sensor module portions which are arranged at different longitudinal extension positions along the flexible printed circuit board between the first end portion and the second end portion and which each comprise at least one temperature sensor and/or a smoke detector.

The fire protection system for aircraft may include a smoke and fire source detection system and at least one firefighting system coupled to the smoke and fire source detection system via the data and energy supply conductor path. The firefighting system comprises a firefighting control device and a firefighting device, e.g., an extinguisher, which can be activated via the firefighting control device A method for detecting smoke and fire sources, in particular in an aircraft, uses the smoke and fire source detection system according to the first aspect of the invention. The method comprises the steps of fastening one or more sensor module portions of the flexible printed circuit board at spatially separated locations to be monitored for the formation of smoke or fire sources, assigning a location at which smoke or a fire source has been detected to the one or more sensor module portions, whose temperature sensor or smoke detector has detected smoke or the fire source and outputting, through the electronic control device at the data and energy supply interface, a warning signal which gives the postulated location of the formation of smoke or fire sources on the basis of the associated one or more sensor module portions.

A particular advantage of at least some embodiments of invention(s) include the disclosed smoke and fire source detection systems and fire protection systems, it is possible to detect fire sources and smoke at locations which are difficult to access or usually not monitored otherwise, for example behind cabin monuments, in storage compartments, behind interior cladding elements, behind the cockpit fittings or the like, where can develop incipient hazards such as smouldering fires, developing heat or other potential sources of fire formation. As a result of their modular and sequential design, the smoke and fire source detection systems and fire protection systems can make it possible to localize detected fire formation sources and to verify detection results.

The individual smoke and fire source detection systems and fire protection systems can be matched individually and dynamically to the respective monitoring environment, both in the structural setup and in the programming of the installed sensors. For example, field programmable gate arrays (FPGA), application specific integrated circuits (ASIC), programmable logic devices (PLD), microprocessors, microcontrollers or other controllable components can be installed to ensure such programmability.

An individual combination of several such smoke and fire source detection systems is possible by means of selected communication methods such as possibly a common data bus, the formation of a wireless ad-hoc network or by individual discrete wiring. In addition, interfaces for the connection of active and localized firefighting systems can be provided such as, for example, miniaturized electronically activatable extinguisher capsules.

By using standard components which can be assembled in a modular fashion for the sensors and the electrical wiring, flexible configurations can be implemented. Furthermore, the costs for such flexible configurations are very low since standardized electrical interfaces can be used. Built-in self-testing functions, maintenance programs and monitoring function can contribute to the reliability of the smoke and fire source detection systems.

The assembly and installation of the disclosed smoke and fire source detection systems and fire protection systems is advantageously simple, for example, via adhesive surfaces on the underside of the film substrates or by using Velcro fasteners or hook and loop tape. The smoke and fire source detection systems and fire protection systems are very space-saving since their thickness is only a few millimetres. In addition, due to the modular design and the simple application, the possibility for repairing or exchanging defective parts is given at any time in a simple manner.

According to some embodiments of the smoke and fire source detection system, at least one of the sensor module portions has a sensor control device which is designed to actuate the temperature sensor and/or the smoke detector of the sensor module portion. This sensor control device can, for example, be an FPGA, an ASIC, a PLD, a microcontroller or a microprocessor.

According to some further embodiments of the smoke and fire source detection system, the first end portion furthermore comprises a serial data bus interface coupled to the electronic control device, for example, a CAN bus interface or a FlexRay interface. The data bus interface can be single-core or two-core in this case.

According to some further embodiments of the smoke and fire source detection system, the first end portion can furthermore comprise at least one wireless transmission interface coupled to the electronic control device. Such wireless transmission interfaces can, for example, be wireless local area network (WLAN) interfaces, radio frequency identification device (RFID) interfaces or interfaces for an inductive data exchange such as wireless power transfer Qi interfaces.

According to some further embodiments of the smoke and fire source detection system, at least one system-internal data bus line can run in the electrical conductor layer between the first end portion and the second end portion, which couples the sensor module portions to one another in data-communicative operative communication.

According to some further embodiments of the smoke and fire source detection system, at least one of the sensor module portions can have a temperature sensor with cascaded temperature sensor elements having different sensor threshold values. Such cascaded temperature sensor elements combined with neighbouring sensor module portions and the temperature sensor elements thereof can enable a finer localization of fire sources.

According to some further embodiments of the smoke and fire source detection system, at least one of the sensor module portions can have a temperature sensor with an adjustable sensor threshold value and a sensor control device which is designed to set the sensor threshold value of the temperature sensor. This affords the advantage that depending on the placement of the sensor module portion in a region to be monitored for the formation of fire sources, the sensitivity of the temperature sensor can be set flexibly and in particular dynamically via a remote access after assembly in an area which is difficult to access. In this case, in some embodiments the at least one of the sensor module portions can have a smoke detector. The sensor control device can further plausibilize, e.g., correlate, measured values of the smoke detector with measured values of the temperature sensor, in particular in order to increase the reliability when notifying potential fire sources.

According to some further embodiments of the smoke and fire source detection system, the electronic control device can comprise an FPGA, an ASIC, a PLD, a microcontroller or a microprocessor.

According to some embodiments of the fire protection system, the firefighting control device can be designed to activate the firefighting means depending on control signals received from the electronic control device of the smoke and fire source detection system via the data and energy supply conductor path. This affords the advantage that extinguishing attempts can be undertaken as early as possible in the warning chain and in an automated or semi-automated manner with the aid of the firefighting system in order to be able to contain the propagation of fire sources at an early stage. It is particularly advantageous in this case that due to the localizability of the detected fire source as a result of the spatial distribution of the sensor module portions, local firefighting systems can be specifically activated which need only be fitted with suitably small quantities or small design variants of firefighting means due to the proximity of the postulated fire source.

According to some further embodiments of the fire protection system or the smoke and fire source detection system, one or more of the sensor module portions of the smoke and fire source detection system can be adhesively fastened behind a cabin monument of the aircraft, behind an interior cladding element of the aircraft or behind a cockpit fitting of the aircraft. As a result, areas inside an aircraft which are difficult to access, difficult to see into and/or spatially constricted can be effectively monitored for the formation of smoke or fire sources.

The above configurations and further developments can be combined with one another insofar as is appropriate. Further possible configurations, further developments and implementations of the invention also comprise combinations of features of the invention described previously or hereinafter with reference to the exemplary embodiments, which are not explicitly mentioned. In particular, the person skilled in the art will also add individual aspects as improvements or additions to the respective basic form of the present invention.

SUMMARY OF THE FIGURES

The present invention will be explained in detail hereinafter with reference to the exemplary embodiments given in the schematic figures. In the figures here:

FIG. 3 shows a schematic block diagram of a fire protection system according to one further embodiment of the invention;

FIGS. 5a, 5b, 5c and 5d show schematic block diagrams of sensor modules for use in a smoke and fire source detection system or a fire protection system according to further embodiments of the invention;

Figure 1:
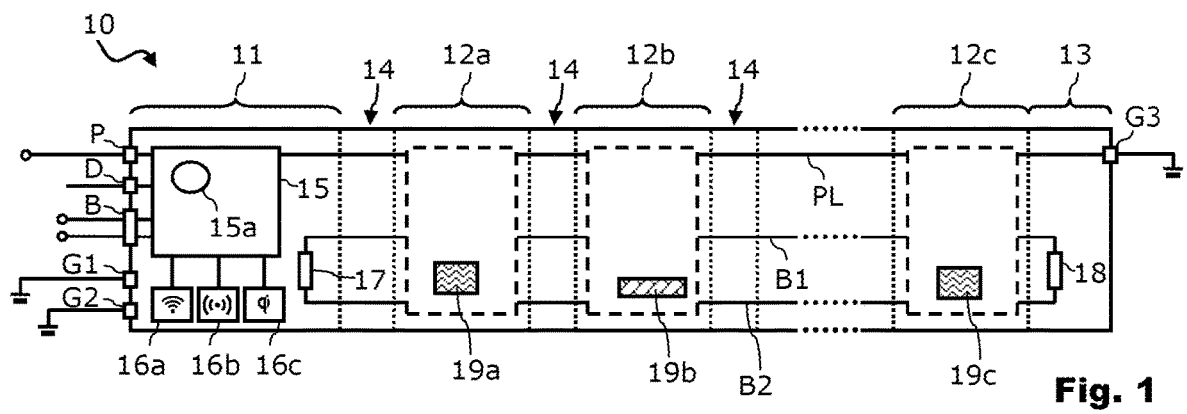
FIG. 1 shows a schematic block diagram of a smoke and fire source detection system according to one embodiment of the invention.

The appended figures should impart a further understanding of embodiments of the invention. They illustrate embodiments and in connection with the description serve to explain principles and concepts of the invention. Other embodiments and many of the said advantages are obtained with reference to the drawings. The elements of the drawings are not necessarily shown to scale with respect to one another. Direction-giving terminology such as "top", "bottom", "left", "right", "above", "below", "horizontal", "vertical", "front", "back" and similar details are only used for explanatory purposes and do not serve to restrict the generality to specific embodiments as shown in the figures.

In the figures of the drawings, elements, features and components which are the same, functionally the same and have the same effect, unless specified otherwise, are each provided with the same reference numbers.

DESCRIPTION OF EXEMPLARY EMBODIMENTS

In the following description, reference is made to flexible printed circuits (FPC) which comprise conductor paths and electric circuits on insulating flexible film substrates, which are applied to the film substrates by suitable printing techniques. In this case, one or more electrical contact points on the printed circuit boards are coupled electrically to one another by the printed conductor paths and electric circuits. Special printing production methods enable the formation of two-dimensional conductor path patterns on the film substrates. For example, a copper layer having a thickness between 10 μm and 200 μm can be laminated on a polyimide substrate between 2 μm and 50 μm thick, in particular about 10 μm to 15 μm thick. This copper layer can then be treated by etching technology to expose the two-dimensional conductor path pattern.

FPCs make it possible to form electric functional modules and a targeted electrical contacting in a very narrow space since the FPCs have a thickness of only a few millimetres. In addition, electrical systems constructed from FPCs are very light and allow ordered conductor path guides to be maintained even under mechanical tensile, shear, torsional or vibrational loading. An adaptation to different installation or application conditions can be accomplished by additional partial stiffening of the film substrate so that electrical systems based on FPCs can be configured three-dimensionally.

FPCs in the sense of the present invention can cooperate electrically with external electrical components via solder connections, adhesive connections, welded connections or also plug-in connections. Plug-in connections can be implemented, for example, via penetrating plug-in connectors, which mechanically pierce an insulation layer formed via the electrical conductor paths and the film substrate and optionally a conductor-specific film insulation and contact the conductor paths electrically with the aid of mechanical contact elements.

Further electronic elements can be applied to the film substrate, for example, as surface mounted devices (SMDs) and electrically connected in a suitable manner to the printed conductor paths and circuits. In addition, integrated circuits can be formed on the film substrate of an FPC.

FIG. 1 shows an exemplary schematic illustration of a smoke and fire source detection system 10 in a block diagram. The smoke and fire source detection system 10 can, for example, be implemented in an aircraft such as the passenger aircraft A shown as an example in FIG. 4. The smoke and fire source detection system 10 can be implemented as part of a fire protection system, for example, of the fire protection system 20 illustrated and explained as an example in connection with FIG. 3. The fire protection system 20 can also, for example, be implemented in an aircraft such as the passenger aircraft A shown as an example in FIG. 4.

Figure 2:
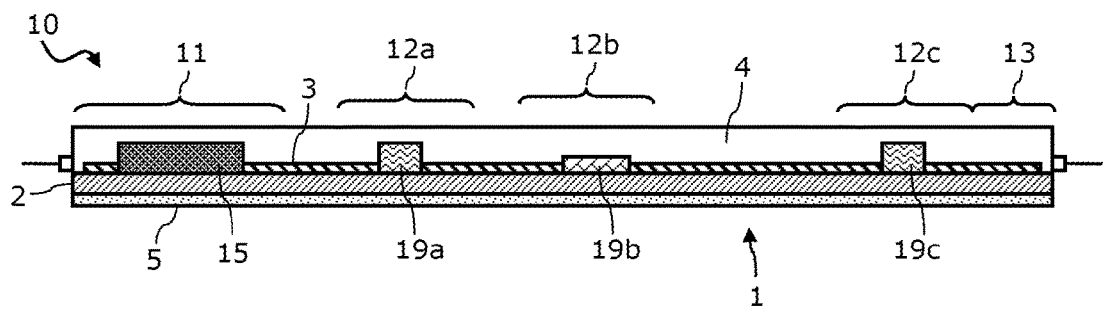
FIG. 2 shows a schematic diagram of the layer structure of the smoke and fire source detection system in FIG. 1.

FIG. 2 shows a schematic diagram of the layer structure of the smoke and fire source detection system 10 of FIG. 1. As shown in FIG. 2, a smoke and fire source detection system 10 comprises a flexible circuit board 1, which for example is configured as a flexible band with a film substrate 2, a conductor layer 3 formed on the film substrate 2 and a covering insulating layer 4 formed on the conductor layer 3. The film substrate 2 can, for example, consist of a resin film with sufficient flexibility or comprise such a resin film. An exemplary material for the formation of the resin film can be a polyimide film, which has a good heat resistance and a suitable mechanical stability and a good chemical resistance. The film substrate 2 can have a thickness of about 2 μm to 50 μm, preferably between about 5 μm and 30 μm, quite particularly preferably between about 10 μm and 15 μm.

The external shape of the film substrate 2 and therefore of the flexible printed circuit 1 can overall be configured with a generally rectangular, flat and strip-shaped shape which extends in the longitudinal direction of the flexible printed circuit 1. In particular, the flexible printed circuit 1 can comprise a first end portion 11 forming interfaces and a second end portion 13 located on the opposite side of the strip-shaped extension. One or more conductor path portions run between the first end portion 11 and the second end portion 13, which conductor path portions have been produced from the conductor layer 3 by suitable structuring measures such as laminating and subsequent selective etching. The conductor path portions generally run through a number of sensor module portions 12a, 12b and 12c which are located along the extension of the strip-shaped flexible printed circuit 1 at different longitudinal extension positions. Metal films such as stainless steel films, titanium films, gold films, silver films, platinum films, copper films or films made of corresponding alloys of the same materials which are structured by suitable processing measures to form a two-dimensional conductor path pattern can be used to form the conductor layer 3. However, it can also be possible to combine conductor paths to form a two-dimensional conductor path pattern by location-selective vapour deposition or other types of application of metal materials such as stainless steel, titanium, gold, silver, platinum, copper or corresponding alloys of the same materials. Conductor path patterns formed in such a manner can, in particular have a thickness between 10 μm and 200 μm.

Naturally it should be clear that the conductor layer 3 itself can consist of several sublayers, whose thickness overall is negligible compared with the surface extension of the conductor path pattern. Therefore, when there is talk of a two-dimensional conductor path pattern in the present disclosure, this means a conductor path pattern which certainly can optionally be constructed in several planes in the plane of the conductor layer 3 but whose extension in one spatial direction is considerably less than the extension in the other two spatial directions.

Various further devices such as, for example, control devices 15 or sensor modules 19a, 19b or 19c can be applied to the film substrate 2 in electrical contact with contact points of the conductor layer 3. The control devices 15 can, for example, be field programmable gate arrays (FPGA), application specific integrated circuits (ASIC), programmable logic devices (PLD), microprocessors, microcontrollers or other controllable components. The sensor modules 19a, 19b or 19c can, for example, comprise surface mounted devices (SMDs). For example, smoke detectors, heat sensors, chemical sensors, gas sensors such as carbon monoxide sensors or nitrogen oxide sensors, microfluid elements, brightness sensors, infrared sensors, optronic sensors, micro-optic or micro-electromechanical sensors (MEMS) and similar types of sensors can be used as sensor modules 19a, 19b or 19c and applied to various ones of the sensor module portions 12a, 12b and 12c.

For example, metal oxide gas sensor elements can also be used as sensor modules 19a, 19b or 19c, which can measure the consequences of the action of various gases based on a change in the conductance of a gas-sensitive metal oxide semiconductor layer. Metal oxide gas sensor elements can detect changes in conductance depending on the type of gas for oxidizing or reducing gases in concentration ranges of up to a few parts per billion. As a result, several gas-sensitive layers can also be used in a metal oxide gas sensor element which can also evaluate gas mixtures. The use of metal oxide gas sensor elements as sensor modules 19a, 19b or 19c on the sensor module portions 12a, 12b and 12c can advantageously serve to measure the air quality of the ambient air in the local environment of the sensor module portions 12a, 12b and 12c. Frequently, the increase in the fraction of certain gases in the ambient air can be an early warning indicator for potential fire sources. The smoke and fire source detection system 10 can with the aid of distributed metal oxide gas sensor elements be capable of outputting indicator signals which can be taken into account in maintenance cycles for a preventative maintenance strategy with regard to potential fire locations.

As an example, without restricting the generality to the sensor module portions 12a, 12b and 12c, respectively one sensor module is shown in FIGS. 1 and 2 but it should be clear that also no sensor module or more than one sensor module can be implemented on the sensor module portions 12a, 12b and 12c. Furthermore, the type of sensor modules per sensor module portions 12a, 12b and 12c is not restricted and it can be possible to arrange a number of sensor modules of the same type or of different sensor type on one or more sensor module portions 12a, 12b and 12c. Furthermore, one or more control devices 15 can also be implemented on the sensor module portions 12a, 12b and 12c even if a control device 15 is only illustrated as an example in the end portion 11 in FIGS. 1 and 2. The type of control devices 15 can also differ from sensor module portion to sensor module portion—for example, a microprocessor can be implemented on one sensor module portion and an FPGA can be implemented on another sensor module portion.

The active devices, i.e. those components which perform active measurements or signal outputs, such as for example the control device 15 of the first end portion 11 or control devices such as FPGAs, ASICs or microprocessors of the sensor module portions 12a, 12b and 12c can be locally bridged via supercapacitors or ultracapacitors. The supercapacitors can briefly provide small currents to receive data and to temporarily maintain communication capability of the control device 15 or the active devices of the sensor module portions 12a, 12b and 12c, whereby in the event of a failure of the external power supply, static storage devices of the control devices or active devices are supplied with electrical energy from the charge stored in the supercapacitors for a certain emergency running time. This affords the advantage that in the event of a fire outbreak and corresponding impairment of the external power supply, the smoke and fire source detection system 10 remains functional at least until the active devices of the sensor module portions 12a, 12b and 12c have introduced local firefighting measures or have at least delivered warning signals to an external system.

A casing layer 4 as a potting layer of flexible dielectric material can be arranged above the conductor layer 3 and optionally the control devices 15 and sensor modules 19a, 19b or 19c, which casing layer embeds the same components in the flexible printed circuit 1. As a result, a robust protective structure is formed to protect the flexible printed circuit 1. In particular, the casing layer 4 can consist of a fireproof or at least fire-retardant material. Plastics can be used as material for the casing layer 4 such as, for example, polyimide (PI), polyethylene naphthalate (PEN), polyethylene terephthalate (PET), epoxide, acrylic, phthalic acid anhydride (PSA) or combinations of these materials.

An adhesive layer 5, for example, made of acrylic adhesives, epoxy adhesives or elastomer-based resol phenol adhesives can be arranged on the side of the film substrate 12 facing away from the conductor layer 3 and the casing layer 4. In particular, resol phenol adhesives can have favourable flame-retarding properties for a smoke and fire source detection system 10. It can also be possible to implement a mechanical adhesion-promoting layer such as a hook layer or a loop layer of a hook-and-loop adhesive system or Velcro connection system as adhesive layer 5. By means of the adhesive layer 5, the flexible printed circuit 1 or the sensor module portions 12a, 12b and 12c can be adhesively applied at suitable points in an aircraft A, in particular at difficult-to-access and spatially constricted locations such as behind a cabin monument of the aircraft A, behind an interior cladding element of the aircraft A or behind a cockpit fitting of the aircraft A.

FIG. 1 shows the functional structure of the smoke and fire source detection system 10 described in connection with FIG. 2. In this case, the view in FIG. 1 can be seen as a plan view of the flexible printed circuit 1, as is illustrated in FIG. 2 in lateral sectional view.

The smoke and fire source detection system 10 has a first end portion 11, shown on the left in FIG. 1, with an electronic control device 15 and a data and energy supply interface P coupled to the electronic control device 15. This electronic control device 15 can, for example, be an FPGA, an ASIC, a PLD, a microcontroller or a microprocessor, which is applied to the film substrate 2. The first end portion 11 serves as input and output module for communication from and with the downstream sensor module portions 12a, 12b and 12c. In addition to the coupled data and energy supply interface P, which on the one hand ensures a power supply of the active components of the sensor module portions 12a, 12b and 12c and on the other hand enables the exchange of data between the smoke and fire source detection system 10 and external devices or network nodes, the first end portion 11 can have a serial data bus interface B coupled to the electronic control device 15. Furthermore, a discrete input/output interface D can be provided for the exchange of configuration data of the control device 15. The data and energy supply interface P can, for example, be a PoE interface ("power over ethernet") or a PLC interface ("powerline communication").

The control device 15 can also have LED displays 15a via which the status of the smoke and fire source detection system 10 can be read off, without needing to individually check the individual sensor module portions 12a, 12b and 12c which are possibly installed at locations which are difficult to access or which cannot be seen.

In addition to the possibility of wired data exchange via the interfaces P, D and/or B, wireless communication modules 16a, 16b, 16c can also be provided on the first end portion 11. For example, the smoke and fire source detection system 10 can have a WLAN or WiFi interface 16a, an RFID interface 16b or an interface 16c for inductive data transmission such as a Powermat, a WiTricity or a Qi interface. The first end portion 11 can additionally have ground connections G1 and G2 via which in each case the casing or the direct current supply line can be grounded.

Located on an opposite end to the first end portion 11 of the flexible printed circuit 1, shown on the right in FIG. 1, is a second end portion 13 with a ground connection G3 which grounds the power supply of the sensor module portions 12a, 12b and 12c at the end of the flexible printed circuit 1. In the electrical conductor layer 3 a data and energy supply conductor path PL runs between the data and energy supply interface P of the first end portion 11 and the ground connection G3 of the second end portion 13. The data and energy supply conductor path PL is used for connecting the active components 19a, 19b, 19c of one or more sensor module portions 12a, 12b and 12c. These sensor module portions 12a, 12b and 12c can be spaced apart from one another by regions 14 without active components (see FIG. 5A). The regions 14 can have different lengths so that the sensor module portions 12a, 12b and 12c can be arranged specifically at different longitudinal extension positions along the flexible printed circuit 1 between the first end portion 11 and the second end portion 13.

In addition to the data and energy supply conductor path PL, the sensor module portions 12a, 12b and 12c can also be connected to one another via a system-internal data bus line B1; B2. This system-internal data bus line B1; B2 can—as shown in FIGS. 1, 2, 3 and 6, have two cores which are terminated in the first end portion 11 via an end resistance 17 and in the second end portion 13 via an end resistance 18. The active components of the individual sensor module portions 12a, 12b and 12c can communicate with one another via the system-internal data bus line.

In FIGS. 1, 2, 3 and 6, three sensor module portions 12a, 12b and 12c are shown explicitly in each case but it should be clear that the number of sensor module portions can vary according to the application and that more or less than three sensor module portions 12a, 12b and 12c can also be provided.

The sensor module portions 12a, 12b and 12c are fitted with active components 19a, 19b, 19c in order to be able to provide corresponding sensors for the detection of smoke or incipient fire sources at the respective longitudinal extension positions. Examples for the configuration of such sensor module portions 12 which do not restrict the generality are illustrated as an example in FIGS. 5B, 5C and 5D.

A sensor module portion 12 can, for example, comprise a temperature sensor TS with cascaded temperature sensor elements having different sensor threshold values. In the example of module (B), such a temperature sensor TS with a cascade of two temperature sensor elements is shown, wherein however it should be clear that a cascade of more than two temperature sensor elements can also be implemented. The temperature sensor elements can, for example, be bimetal sensors, thermorelays or memory alloy sensors whose trigger temperature characterizes the exceeding of a temperature threshold value which can be set, by the ambient temperature. The triggering of such temperature sensor elements can be communicated to the electronic control device 15 and then to the outside via the data and energy supply conductor path PL or the system-internal data bus line B1.

FIG. 5C shows a sensor module portion 12 with a sensor control device MP and a simple temperature sensor TS with the sensor control device MP. The sensor threshold value thereof can, for example, be adjustable so that the electronic control device 15 can instruct the local sensor control device MP via the system-internal data bus line to set the sensor threshold value of the connected temperature sensor TS to a predefinable value. The sensor control device MP can also detect a triggering of the temperature sensor TS and return as indicator signal to the electronic control device 15. The sensor control device MP can additionally have other or adjacent sensor module portions 12 for wireless communication with sensor control devices MP via a device-internal communication module.

FIG. 5D shows a sensor module portion 12 with a sensor control device MP, a simple temperature sensor TS with the sensor control device MP and an additional smoke detector S. The smoke detector S can detect the local development of smoke in the vicinity of the sensor module portion 12. As a result, in addition to the measured values of the temperature sensor TS, the sensor control device MP can also access the measured values of the smoke detector S. For example, the sensor control device MP can only return an indicator signal to the electronic control device 15 when a comparison of the measured values of the temperature sensor TS with the measured values of the smoke detector S reveal a sufficiently high probability that a fire source has actually been detected. As a result, erroneously output indicator signals and therefore error alarms can be advantageously avoided. The smoke detector S can also be a metal oxide gas sensor element which can measure the consequences of the action of various gases based on a change in the conductances of a gas-sensitive metal oxide semiconductor layer. Such a metal oxide gas sensor element can be implemented on the sensor module portion 12 instead of a smoke detector S or additionally to a smoke detector S. It should also be clear that in FIGS. 5A, 5B, 5C and 5D are example and for reasons of clarity only one sensor element S is illustrated in each of FIGS. 5A, 5B, 5C and 5D, but more than one sensor element S of the same or different sensor type can be installed in each of the sensor module portions 12.

Figure 6:
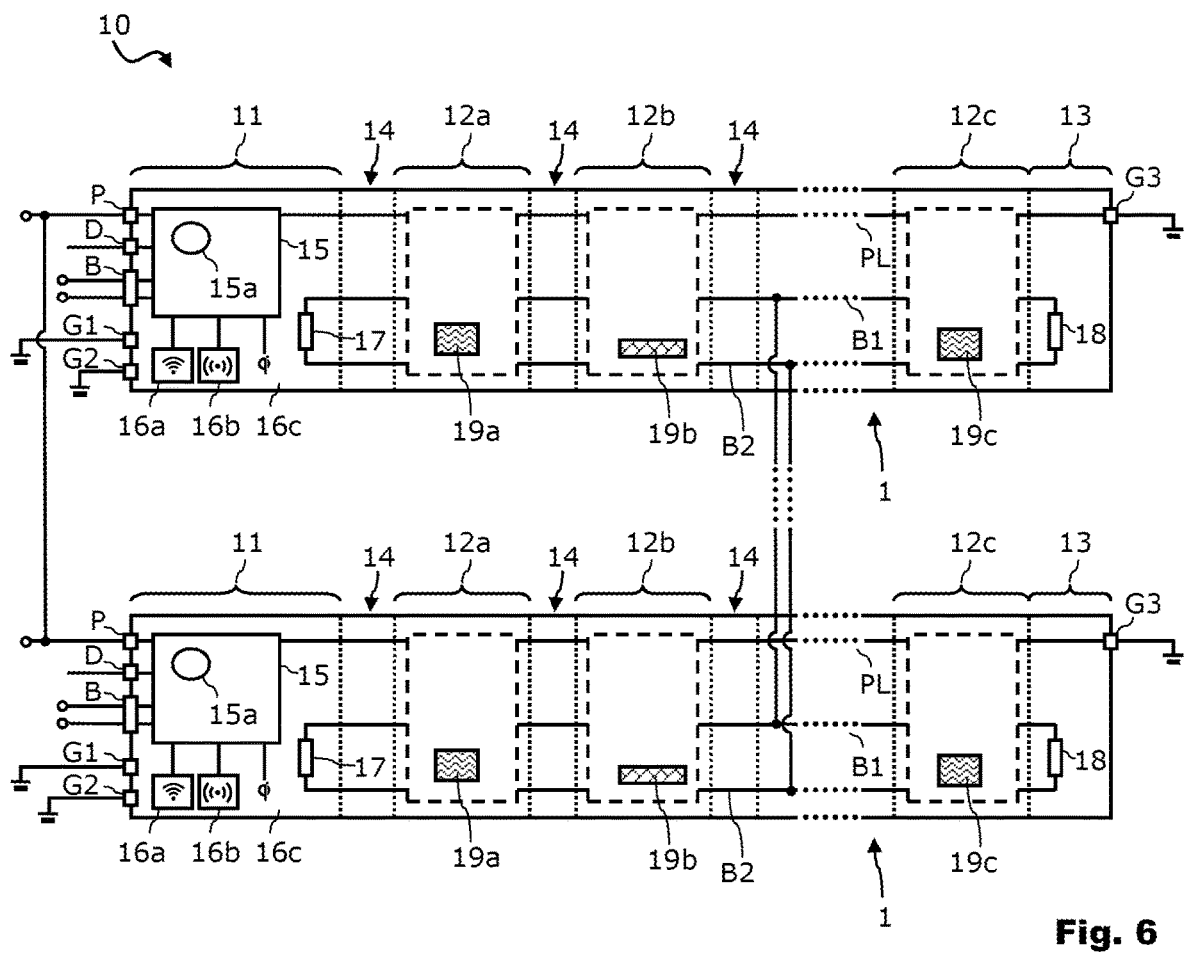
FIG. 6 shows a schematic block diagram of a smoke and fire source detection system according to a further embodiment of the invention.

As shown in FIG. 6, several such flexible printed circuits 1 can be coupled to one another via their data and energy supply interfaces P and/or the system-internal data bus line B1, B2. For example, a plurality of strip- or band-shaped flexible printed circuits 1 next to one another can be coupled to form a matrix of sensor module portions 12a, 12b and 12c which then enable a surface distribution of sensor module portions 12a, 12b and 12c in a smoke and fire source detection system 10. Such "sensor module carpets" can serve to be used to clad difficult-to-access large-area regions behind side walls of cabin monuments in aircraft or behind larger instrument panels with many electric instruments and cables in cockpits of aircraft and to ensure a two-dimensionally resolved localization of potential fire sources via the corresponding distribution of sensor module portions 12a, 12b and 12c of adjacent flexible printed circuits 1.

FIG. 3 shows how the smoke and fire source detection system 10 illustrated and explained in connection with FIGS. 1, 2, 5 and 6 can be used in a fire protection system 20. At suitable points along the extension of the flexible printed circuit 1, one or more firefighting systems 21 coupled to the smoke and fire source detection system 10 via the data and energy supply conductor path PL can be installed. These firefighting systems 21 have an active firefighting control device 25 such as an FPGA, an ASIC, a PLD, a microcontroller or a microprocessor. The firefighting control device 25 can have corresponding status displays 25a, a data and energy supply interface P, ground interfaces G1 and G2 as well as optionally wireless communication interfaces 26a, 26b and 26c, similarly to the first end portion 11 of the flexible printed circuit 1. A firefighting systems, e.g., extinguishers, 22 of the firefighting system 21 can be activated via the firefighting control device 25, for example, an actuatable cartridge with extinguishing liquid or extinguishing foam.

Depending on control signals which are output by the electronic control device 15 of the smoke and fire source detection system 10 via the data and energy supply conductor path PL, the firefighting control devices 25 can be actuated in a targeted and spatially resolved manner to initiate local firefighting measures. These local firefighting measures can be based on which of the sensor module portions of the smoke and fire source detection system 10 has detected smoke and/or potential fire sources.

Figure 4:
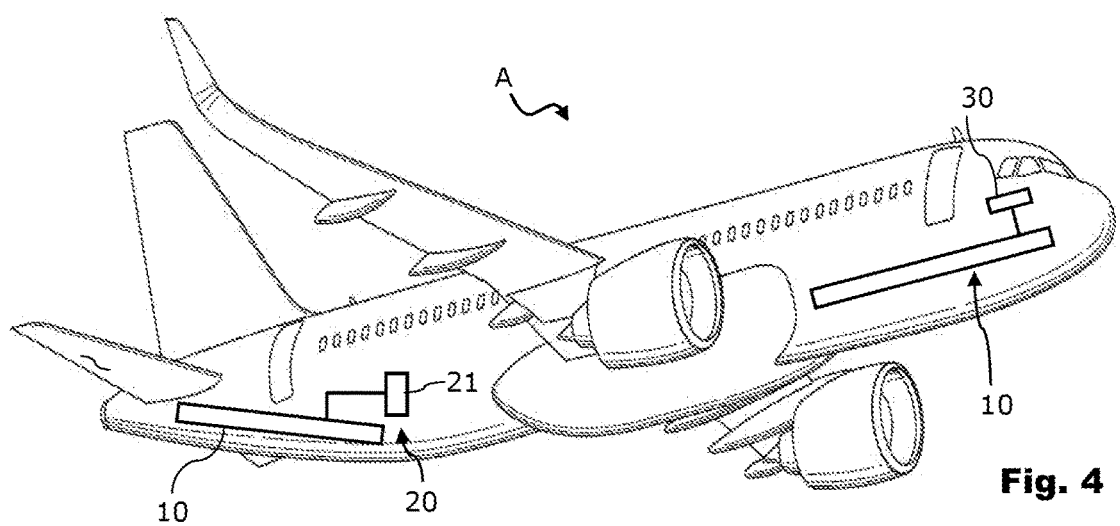
FIG. 4 shows a schematic illustration of an aircraft with a smoke and fire source detection system according to a further embodiment of the invention arranged in the interior of the aircraft.
Figure 7:
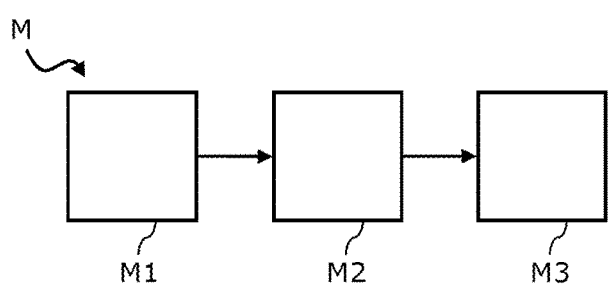
FIG. 7 shows a flow diagram of a method for detecting smoke and fire sources according to a further embodiment of the invention.

FIG. 7 shows a method M for detecting smoke and fire sources, in particular for use in an aircraft. The method M can, for example, be used in an aircraft A as shown in FIG. 4. In this case, the method M can be implemented with the assistance of the components of a smoke and fire source detection system 10 explained in connection with FIGS. 1, 2, 5 and 6 or in connection with the components of a fire protection system 20 explained in connection with FIG. 3.

The method M comprises as first step M1 a fastening M1 of one or more sensor module portions 12*a*, 12*b* and 12*c* of a flexible printed circuit 1 of a smoke and fire source detection system 10 at spatially separate locations to be monitored for the formation of smoke and fire sources. If one or more of the sensor module portions 12*a*, 12*b* and 12*c* should detect smoke or fire sources via their temperature sensors TS or smoke detectors S, in a second step M2 this sensor module portion can be assigned to the postulated location of the occurrence of smoke or fire sources. The electronic control device 15 at the data and energy supply interface P can then, in a third step M3, output a warning signal which gives the postulated location of the occurrence of smoke or fire sources on the basis of the associated sensor module portions 12*a*, 12*b* and 12*c*. The information of the warning signal can, for example, be output to a downstream external network 30 such as, for example, a network 30 in an aircraft A (see FIG. 4) which can then use the information for a targeted defect search, a targeted and prompt firefighting attempt or for maintenance purposes.

In the preceding detailed description, various features to improve the stringency of the representation have been combined in one or more examples. However, it should be clear that the above description is merely of an illustrative nature but not restrictive. It serves to cover all alternatives, modifications and equivalents of the various features and exemplary embodiments. Many other examples are immediately and directly clear to the person skilled in the art on the basis of his technical knowledge in view of the above description.

The exemplary embodiments have been selected and described in order to be able show the principles forming the basis of the invention and their possible applications in practice as well as possible. As a result, persons skilled in the art can optimally modify and use the invention and its various exemplary embodiments in relation to the intended usage purpose. In the claims and the description, the terms "containing" and "having" are used as neutral linguistic terms for the corresponding term "comprising". Furthermore, the use of the term "a" should not fundamentally eliminate a plurality of such described features and components. In addition, the term "or" is to be treated as covering either or both options unless stated otherwise.

The invention claimed is:

1. A smoke and fire source detection system comprising:
a flexible printed circuit board including a film substrate and an electrical conductor layer formed on the film substrate,
wherein the electrical conductor layer includes a two-dimensional conductor path pattern in a plane of the electrical conductor layer,
wherein the flexible printed circuit board comprises:
a first end portion including an electronic control device and a data and energy supply interface coupled to the electronic control device;
a second end portion including a ground connection;
a data and energy supply conductor path formed in the electrical conductor layer extending from the data and energy supply interface of the first end portion to the ground connection of the second end portion; and
sensor module portions each arranged at a different longitudinal extension position along the flexible printed circuit board between the first end portion and the second end portion,
wherein at least a plurality of the sensor module portions are configured to sense smoke and include a smoke detector, and
wherein at least a plurality of the sensor module portions are configured to sense fire and include a temperature sensor.

2. The smoke and fire source detection system according to claim 1, wherein each of the sensor module portions includes a sensor control device which is designed to actuate the temperature sensor and/or the smoke detector of the sensor module portion.

3. The smoke and fire source detection system according claim 1, wherein the first end portion further comprises a serial data bus interface coupled to the electronic control device.

4. The smoke and fire source detection system according to claim 1, wherein the first end portion further comprises at least one wireless transmission interface coupled to the electronic control device.

5. The smoke and fire source detection system according to claim 1, further comprising a system-internal data bus line in the electrical conductor layer between the first end portion and the second end portion, wherein the system internal data bus line couples the sensor module portions to one another to provide data-communicative operative communication with the sensor module portions.

6. The smoke and fire source detection system according to claim 1, wherein at least one of the sensor module portions has a temperature sensor with cascaded temperature sensor elements each having a different sensor threshold value than others of the temperature sensor elements.

7. The smoke and fire source detection system according to claim 1, wherein at least one of the sensor module portions includes a temperature sensor having an adjustable sensor threshold value and a sensor control device configured to set the sensor threshold value of the adjustable temperature sensor.

8. The smoke and fire source detection system according to claim 7, wherein at least one of the sensor module portions includes a smoke detector and the sensor control device is configured to plausibilize measured values of the smoke detector with measured values of the temperature sensor.

9. The smoke and fire source detection system according to claim 1, wherein the electronic control device comprises at least one of a field programmable gate arrays, an application specific integrated circuits, a programmable logic device, a microcontroller and a microprocessor.

10. A fire protection system comprising:
a smoke and fire source detection system according to claim 1, and
at least one firefighting system coupled to the smoke and fire source detection system via the data and energy supply conductor path, wherein the at least one firefighting system includes a firefighting control device and a firefighting device configured to be activated by the firefighting control device.

11. The fire protection system according to claim 10, wherein the firefighting control device is configured to activate the firefighting device depending on control signals received from the electronic control device of the smoke and fire source detection system via the data and energy supply conductor path.

12. An aircraft having at least one of the smoke and fire source detection system according to claim 1.

13. The aircraft according to claim 12, wherein at least one of the sensor module portions of the smoke and fire source detection system is adhesively fastened behind a cabin monument of the aircraft, behind an interior cladding element of the aircraft or behind a cockpit fitting of the aircraft.

14. A method for detecting smoke and fire sources using a smoke and fire source detection system including:
a flexible printed circuit board including a film substrate and an electrical conductor layer formed on the film substrate, wherein the electrical conductor layer includes a two-dimensional conductor path pattern in a plane of the electrical conductor layer, wherein the flexible printed circuit board comprises:
a first end portion including an electronic control device and a data and energy supply interface coupled to the electronic control device;
a second end portion including a ground connection;
a data and energy supply conductor path formed in the electrical conductor layer extending from the data and energy supply interface of the first end portion to the ground connection of the second end portion; and
sensor module portions each arranged at a different longitudinal extension position along the flexible printed circuit board between the first end portion and the second end portion and each of the sensor module portions comprise at least one of a temperature sensor and a smoke detector,
the method comprising:
fastening one or more of the sensor module portions of the flexible printed circuit board at spatially separated locations to be monitored for the formation of smoke or fire sources;
assigning a location at which smoke or a fire source has been detected to a respective one of the sensor module portions in response to one of the temperature sensor and/or smoke detector of the respective sensor module portion detecting smoke or the fire source; and
outputting through the electronic control device at the data and energy supply interface a warning signal which gives the postulated location of the formation of smoke or fire sources on the basis of the one or more sensor module portions detecting the smoke or fire source.

15. A configured as a smoke and fire detection system, the flexible printed circuit board including:
a film substrate layer;
an electrical conductor layer on the film substrate layer, wherein the electrical conductor layer includes a two-dimensional conductive pattern;
a first end portion of the flexible printed circuit board includes an electronic control device;
a data interface and an energy supply interface coupled by the conductive pattern to the electronic control device;
a second end portion including a ground connection and connected to the conductive pattern; and
a data path and energy supply path in the conductive pattern which extend from the data and energy supply interface of the first end portion to the ground connection of the second end portion; and sensor module portions each arranged at a different longitudinal position along the flexible printed circuit board between the first end portion and the second end portion,
wherein the sensor module portions are connected by the energy supply path to the energy supply interface and by the data path to the data interface,
wherein at least a first plurality of the sensor module portions include a smoke detector and are configured to detect a condition indicative of smoke, and
wherein at least a second plurality of the sensor module portions include a temperature sensor and are configured to detect a condition indicative of fire.

16. The flexible printed circuit board of claim 15, further comprising an insulating layer covering the electrical conductor layer and the sensor module portions.

17. The flexible printed circuit board of claim 15 further comprising an adhesive layer on a side of the film substrate layer opposite to a side on which is the electrical conductor layer.

18. The flexible printed circuit board of claim 15, wherein the data path includes bus lines extending from the first end portion to the second end portion and connected to each of the sensor module portions.

19. The smoke and fire source detection system of claim 1 wherein at least one of the sensor module portions includes the smoke detector and the fire detector.

20. The flexible printed circuit board of claim 15, wherein at least one of the sensor module portions includes the smoke detector and the fire detector.

* * * * *